(12) United States Patent
Cirkic et al.

(10) Patent No.: US 11,387,849 B2
(45) Date of Patent: Jul. 12, 2022

(54) INFORMATION DECODER FOR POLAR CODES

(71) Applicant: Telefonaktiebolaget LM Ericsson (publ), Stockholm (SE)

(72) Inventors: Mirsad Cirkic, Linköping (SE); Niclas Wiberg, Linköping (SE); Martin Hessler, Linköping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/049,291

(22) PCT Filed: Apr. 20, 2018

(86) PCT No.: PCT/SE2018/050407
§ 371 (c)(1),
(2) Date: Oct. 20, 2020

(87) PCT Pub. No.: WO2019/203706
PCT Pub. Date: Oct. 24, 2019

(65) Prior Publication Data
US 2021/0194509 A1      Jun. 24, 2021

(51) Int. Cl.
*H03M 13/45* (2006.01)
*H03M 13/13* (2006.01)

(52) U.S. Cl.
CPC ......... *H03M 13/458* (2013.01); *H03M 13/13* (2013.01)

(58) Field of Classification Search
CPC ............................ H03M 13/458; H03M 13/13
See application file for complete search history.

(56) References Cited

U.S. PATENT DOCUMENTS

| 2015/0263767 A1* | 9/2015 | Shin ...................... H03M 13/13 714/796 |
| 2019/0132009 A1* | 5/2019 | Cirkic ............... H03M 13/3746 |

(Continued)

FOREIGN PATENT DOCUMENTS

| WO | 2017186307 A1 | 11/2017 |
| WO | 2017188873 A1 | 11/2017 |
| WO | WO-2017186307 A1 * | 11/2017 ............ H03M 13/13 |

OTHER PUBLICATIONS

Hashemi et al. "Simplified Successive-Cancellation List Decoding of Polar Codes" 2016 IEEE International Symposium on Information Theory, pp. 815-819.

(Continued)

*Primary Examiner* — Thien Nguyen
(74) *Attorney, Agent, or Firm* — Sage Patent Group

(57) ABSTRACT

There is provided mechanisms for decoding an encoded sequence into a decoded sequence. A method is performed by an information decoder. The method comprises obtaining a channel output. The channel output represents the encoded sequence as passed through a communications channel. The encoded sequence has been encoded using a polar code. The polar code is representable by a code diagram. The method comprises successively decoding the channel output into the decoded sequence by traversing the code diagram. The method comprises, whilst traversing the code diagram, determining a bit score term for each potential decoding decision on one or more bits being decoded. The method comprises, whilst traversing the code diagram, adding an adjustment term to each bit score term to form a candidate score for said each potential decoding decision. The successive decoding is repeated until all bits of the channel output have been decoded, resulting in at least two candidate decoded sequences. The method comprises discarding all (Continued)

but one of the at least two candidate decoded sequences, resulting in one single decoded sequence.

15 Claims, 11 Drawing Sheets

(56) References Cited

U.S. PATENT DOCUMENTS

2019/0215018 A1* 7/2019 Lin .................. H03M 13/458
2019/0372604 A1* 12/2019 Li .................... H04L 1/0057

OTHER PUBLICATIONS

Extended European Search report dated Mar. 11, 2021 for European Patent Application No. 18915362.0,11 pages.
Chuan Zhang et al.; "Hardware Architecture for List Successive Cancellation Polar Decoder"; IEEE International Symposium on Circuits and Systems (ISCAS); Melbourne, VIC, Australia; Jun. 2014; pp. 209-212 (4 pages).
Zhenzhen Liu et al.; "Parallel Concatenated Systematic Polar Code Based on Soft Successive Cancellation List Decoding"; The 20th International Symposium on Wireless Personal Multimedia Communications (WPMC2017); Bali, Indonesia; Dec. 17, 2017; pp. 181-184 (4 pages).
International Search Report and the Written Opinion of the International Searching Authority, issued in corresponding International Application No. PCT/SE2018/050407, dated Mar. 8, 2019, 12 pages.
Trifonov et al. "A randomized construction of polar subcodes" 2017 IEEE International Symposium on Information Theory (ISIT), 20170625 IEEE, pp. 1863-1867.
Trifonov et al. "Fast Sequential Decoding of Polar Codes" arXiv:1703.06592v2, 2018, pp. 1-19.
Alamdar-Yazdi et al. "A Simplified Successive-Cancellation Decoder for Polar Codes" IEEE Communications Letters, vol. 15, No. 12, Dec. 2011, pp. 1378-1380.
Arikan "Channel polarization: A method for constructing capacity-achieving codes for symmetric binary-input memoryless channels" arXiv:0807.3917v5, 2009, pp. 1-23.
Tal et al. "List Decoding of Polar Codes" arXiv:1206.0050v1, 2012, pp. 1-11.

* cited by examiner

INFORMATION DECODER FOR POLAR CODES

CROSS REFERENCE TO RELATED APPLICATION(S)

This application is a 35 U.S.C. § 371 National Phase Entry Application from PCT/SE2018/050407, filed Apr. 20, 2018, designating the United States, the disclosure of which is incorporated herein by reference in its entirety.

TECHNICAL FIELD

Embodiments presented herein relate to a method, an information decoder, a computer program, and a computer program product for decoding an encoded sequence into a decoded sequence.

BACKGROUND

Polar codes, as presented in "Channel polarization: A method for constructing capacity-achieving codes for symmetric binary-input memoryless channels," IEEE Trans. Inform. Theory, vol. 55, pp. 3051-3073, 2009, are capacity achieving codes, have an explicit construction (i.e., not randomly generated), and have an efficient encoding and decoding algorithm. Apart from the capacity achieving property, which is valid when code-lengths tend to infinity, they have shown good performance for shorter code-lengths.

One issue with existing mechanisms for decoding polar codes lies in the successive decoding (SD) procedure which follows the bit-order of the polar codes. Decoding of polar codes is prone to error propagation and hence, an error made early in the successive decoding procedure will not be corrected, but will instead propagate all the way to the end of the decoding. This will result in a decoding error. Additionally it is more likely to make an error early in the procedure than at the end, see FIG. 2. FIG. 2 shows an example of the amount of information for a bit with index i (for i=1, 2, . . . N where N is the total number of binary digits, and N=1024 in the example) can carry, given that all the previous binary digits 1, 2, . . . , i−1 are known, i.e., where the polar code decoding order is followed.

According to "List decoding of polar codes" by I. Tal and A Vardy, arXiv: 1206.0050, 31 May 2012, a procedure that splits the paths in a binary tree is proposed. The technique keeps track of the most probable paths currently known and disregards the rest. Splitting paths is commonly referred to as branching.

Branching typically occurs at every information bit. Typically, practical implementations of list decoding procedures for polar codes need to use branching with a limited amount of allowed candidate branches, where the cumulative sequence of decoded bits for each candidate branch is represented by a candidate decoded sequence. However, computing the score needed to determine which candidate decoded sequences to keep at each new branching requires considerable processing, adding to the burden of list decoding of polar codes. Further, the candidate score is generally based on the bits processed so far and ignores the impact of bits to come later, which can sometimes cause the decoder to disregard candidates that, if kept, would later turn out to be better than those that are kept.

Hence, there is still a need for improved mechanisms for decoding data having been encoded using polar codes.

SUMMARY

An object of embodiments herein is to provide efficient decoding of polar codes that does not suffer from the issues noted above, or at least where these issues are mitigated or reduced.

According to a first aspect there is presented a method for decoding an encoded sequence into a decoded sequence. The method is performed by an information decoder. The method comprises obtaining a channel output. The channel output represents the encoded sequence as passed through a communications channel. The encoded sequence has been encoded using a polar code. The polar code is representable by a code diagram. The method comprises successively decoding the channel output into the decoded sequence by traversing the code diagram. The method comprises, whilst traversing the code diagram, determining a bit score term for each potential decoding decision on one or more bits being decoded. The method comprises, whilst traversing the code diagram, adding an adjustment term to each bit score term to form a candidate score for said each potential decoding decision. The successive decoding is repeated until all bits of the channel output have been decoded, resulting in at least two candidate decoded sequences. The method comprises discarding all but one of the at least two candidate decoded sequences, resulting in one single decoded sequence.

According to a second aspect there is presented an information decoder for decoding an encoded sequence into a decoded sequence. The information decoder comprises processing circuitry. The processing circuitry is configured to cause the information decoder to obtain a channel output. The channel output represents the encoded sequence as passed through a communications channel. The encoded sequence has been encoded using a polar code. The polar code is representable by a code diagram. The processing circuitry is configured to cause the information decoder to successively decode the channel output into the decoded sequence by traversing the code diagram. The processing circuitry is configured to cause the information decoder to, whilst traversing the code diagram, determine a bit score term for each potential decoding decision on one or more bits being decoded. The processing circuitry is configured to cause the information decoder to, whilst traversing the code diagram, add an adjustment term to each bit score term to form a candidate score for said each potential decoding decision. The successive decoding is repeated until all bits of the channel output have been decoded, resulting in at least two candidate decoded sequences. The processing circuitry is configured to cause the information decoder to discard all but one of the at least two candidate decoded sequences, resulting in one single decoded sequence.

According to a third aspect there is presented an information decoder for decoding an encoded sequence into a decoded sequence. The information decoder comprises an obtain module configured to obtain a channel output. The channel output represents the encoded sequence as passed through a communications channel. The encoded sequence has been encoded using a polar code. The polar code is representable by a code diagram. The information decoder comprises a decode module configured to successively decode the channel output into the decoded sequence by traversing the code diagram. The information decoder comprises a determine module configured to, whilst the code diagram is traversed, determine a bit score term for each potential decoding decision on one or more bits being decoded. The information decoder comprises an add module configured to, whilst the code diagram is traversed, add an adjustment term to each bit score term to form a candidate score for said each potential decoding decision. The successive decoding is repeated until all bits of the channel output have been decoded, resulting in at least two candidate decoded sequences. The information decoder comprises a discard module configured to discard all but one of the at least two candidate decoded sequences, resulting in one single decoded sequence.

Advantageously this provides efficient decoding of a sequence having been encoded using a polar code into a decoded sequence.

Advantageously the use of the adjustment term reduces the amount of processing needed for the information decoder to determine which candidate decoded sequences to keep.

According to a fourth aspect there is presented a computer program for decoding an encoded sequence into a decoded sequence, the computer program comprising computer program code which, when run on an information decoder, causes the information decoder to perform a method according to the first aspect.

According to a fifth aspect there is presented a computer program product comprising a computer program according to the fourth aspect and a computer readable storage medium on which the computer program is stored. The computer readable storage medium could be a non-transitory computer readable storage medium.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
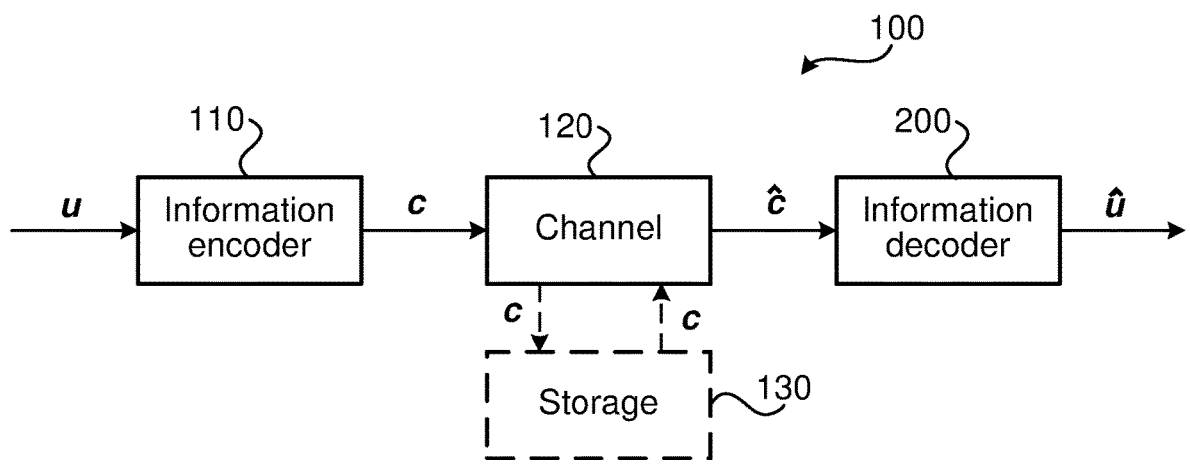
FIG. 1 is a schematic diagram illustrating a communications network according to embodiments.
Figure 2:
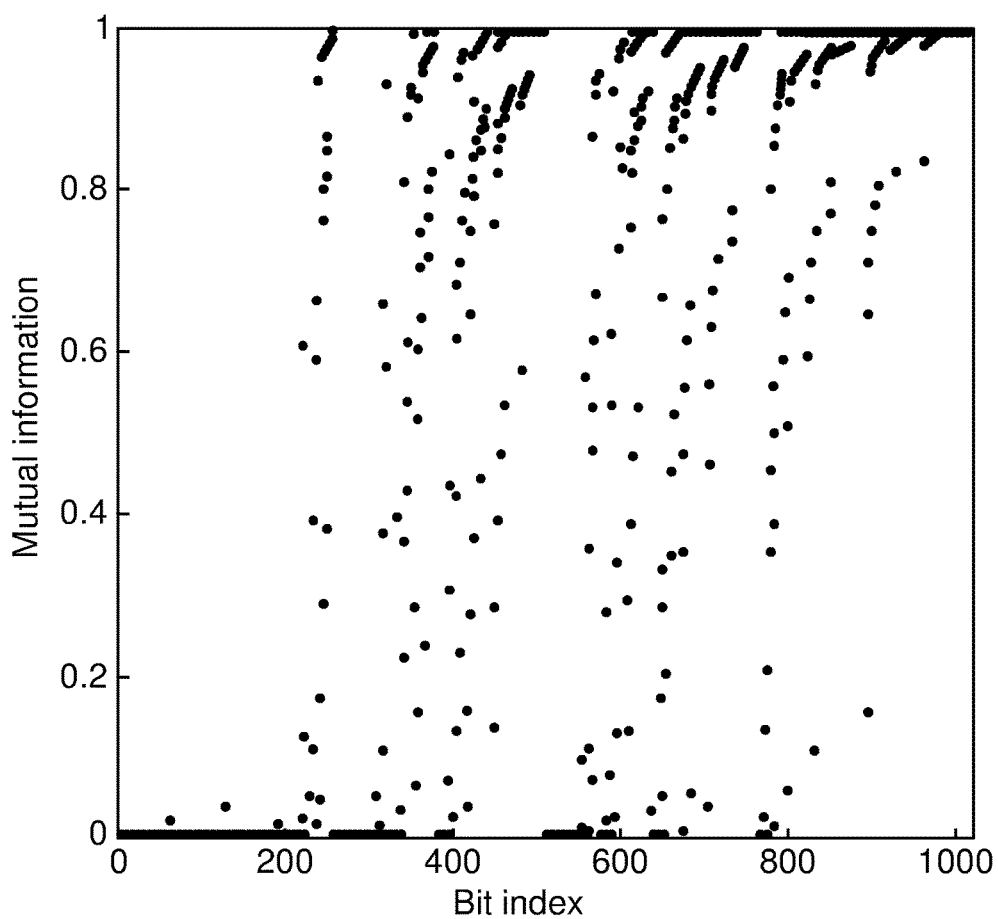
FIG. 2 is a schematic diagram illustrating mutual information according to an embodiment.

FIG. 1 is a schematic diagram illustrating a communications network 100 where embodiments presented herein can be applied. The communications network 100 comprises an information encoder 110 and an information decoder 200. The information encoder 110 is configured to encode an information sequence $u=u_1, u_2, \ldots, u_m$ into an encoded sequence ĉ. The information decoder 200 is configured to decode an encoded sequence ĉ into a decoded sequence û.

The information encoder 110 and the information decoder 200 are separated by a symbolic communications channel 120. The communications channel 120 models how the encoded sequence c is affected between the information encoder 110 and the information decoder 200. For example, the transmission of the encoded sequence c may cause noise or errors to be inserted in the channel output ĉc. Noise could mean that a transmitted "zero" or "one" is received as something that does not exactly correspond to a zero or a one. An error could imply that a transmitted "zero" is received as something that is more probable to be a "one" than a "zero", or vice versa, during transmission over the communications channel 120. Therefore the encoded sequence c as passed through the channel 120 and obtained by the information decoder 200 as ĉ is hereinafter denoted channel output or just received sequence, where ĉ=c if the channel is error-free and ĉ≠c elsewhere. Further, if ĉ=c then also û=u, but if ĉ≠c there is a non-zero probability that û≠u. In order to minimize the probability that û≠u the information encoder 110 during the encoding procedure adds redundancy to the information sequence c in a controlled manner, resulting in the encoded sequence c. The redundancy is added in the controlled manner by using a polar code.

Conversely, at the information decoder 200 the added redundancy is removed from the received encoded sequence ĉ in a controlled manner, resulting in the decoded sequence û. Further, the communications network 100 comprises a (optional) data storage 130. The data storage 130 is assumed to store data losslessly, i.e., without introducing losses in the stored data. Any losses in the data are modelled by the communications channel 120.

The information encoder 110 and the information decoder 200 use a polar code to protect the information sequence u against channel distortions. The information encoder 110 will encode the information sequence c using a predetermined polar code into the encoded sequence c which will then be used in a transmission over the communications channel 120. The received encoded sequence ĉ, which, as disclosed above, can be distorted when passing through the communications channel 120, will be decoded by the information decoder 200 using a polar code successive decoder.

Figure 3:
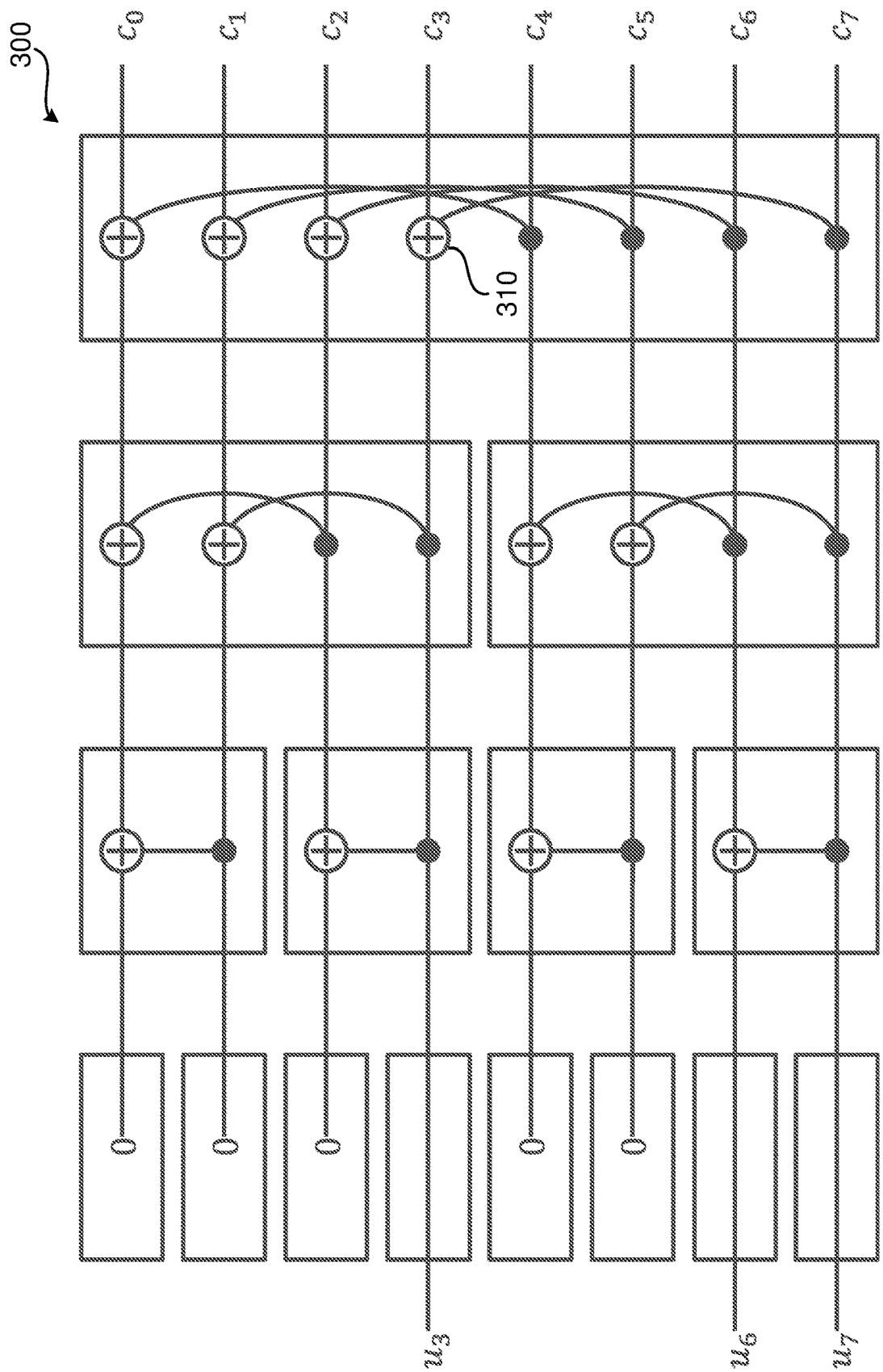
FIGS. 3, 4, 5, 6, 8, and 10 are schematic diagrams illustrating a code diagram, or parts thereof, of a polar code according to embodiments.

FIG. 3 is a schematic diagram illustrating a code diagram 300 of a polar code. In the example of FIG. 3, $u_3, u_6, u_7$ on the left-hand side represents information bits and the zeros on the left-hand side (replacing information bits $u_0, u_1, u_2,$ $u_4$, $u_5$) represents added redundancy bits (having fixed, and thus known, values; in the present example the value 0). The information bits are encoded into a sequence of encoded bits $c_0$, $c_1$, $c_2$, $c_3$, $c_4$, $c_5$, $c_6$, $c_7$ by being added together at XOR gates as specified in the code diagram 300. As an example, at XOR gate 310, the encoded bit $c_3$ is determined as $c_3 = u_3 \oplus u_5$, where $\oplus$ denotes the XOR operator.

Using the polar code example in FIG. 3, the information decoder 200, based on the received encoded sequence, estimates the probabilities of the encoded sequence and then propagates these backwards throughout the polar code structure to calculate the probabilities of the information sequence. The decision made on $u_0$ based on the calculated probability is propagated downwards when the probabilities, or soft values $\gamma_1, \gamma_2, \ldots, \gamma_7$, of $u_1, u_2, \ldots u_7$ are evaluated, see FIG. 4 as referred to below. The same is repeated for $u_1$ and so on, which defines the underlying successive decoding procedure. The better the information decoder 200 is, i.e., the more errors in the received encoded sequence it can correct, the more information can be conveyed over the communication channel w.

When decoding an encoded sequence having been encoded using a polar code, the input to the information decoder 200 is a number of soft values corresponding to the coded bits in encoded sequence on the right-hand side of the code diagram in FIG. 3. The soft values are commonly determined as log-likelihood ratio (LLR) values. A soft value can be positive, zero, or negative. Conventionally, a positive soft value indicates that the corresponding bit value is likely a binary 0, while a negative soft value indicates that the bit value is likely a binary 1. The larger the magnitude of the soft value, the more certain the bit value is.

Figure 4:
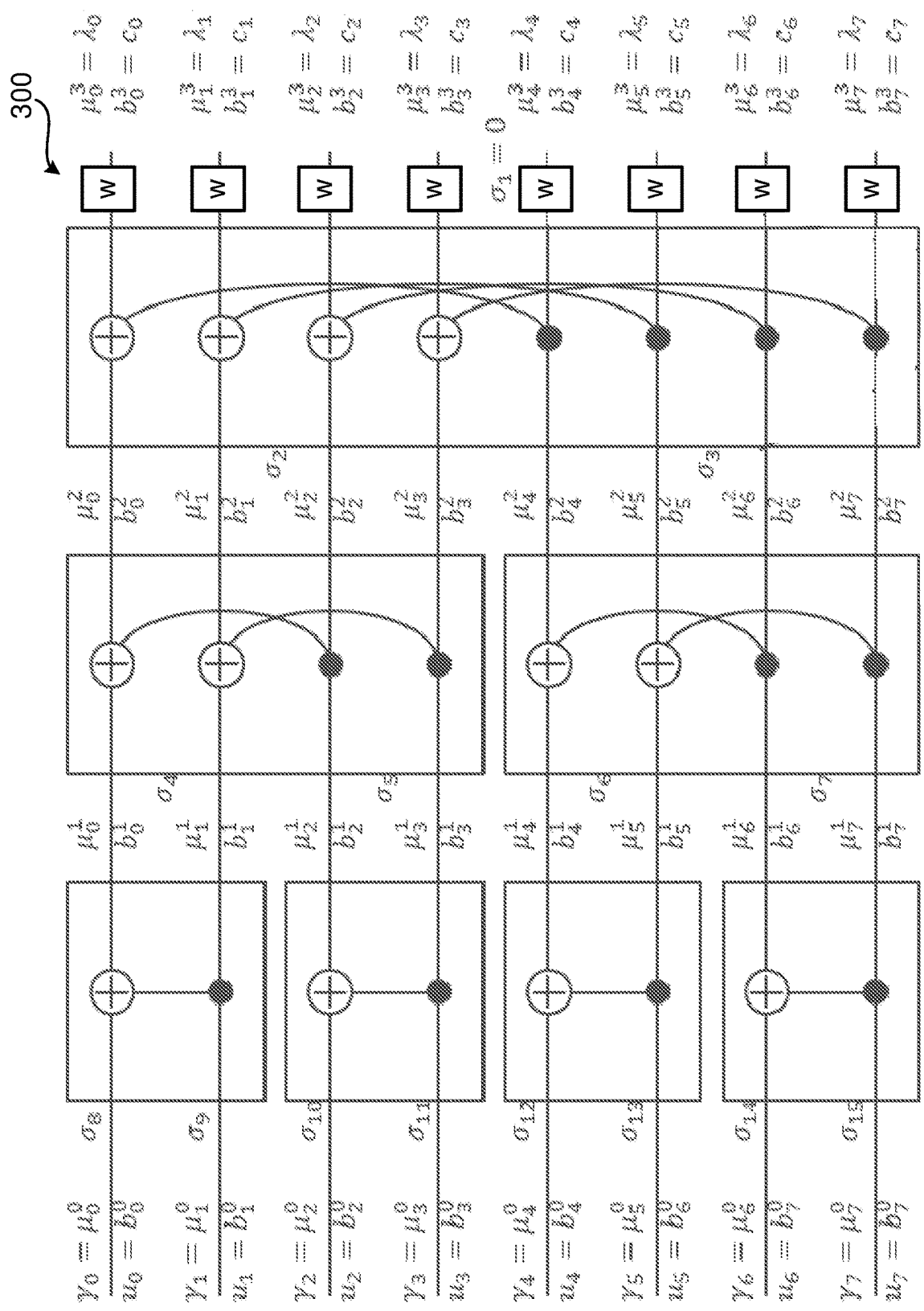
Figure 5A:
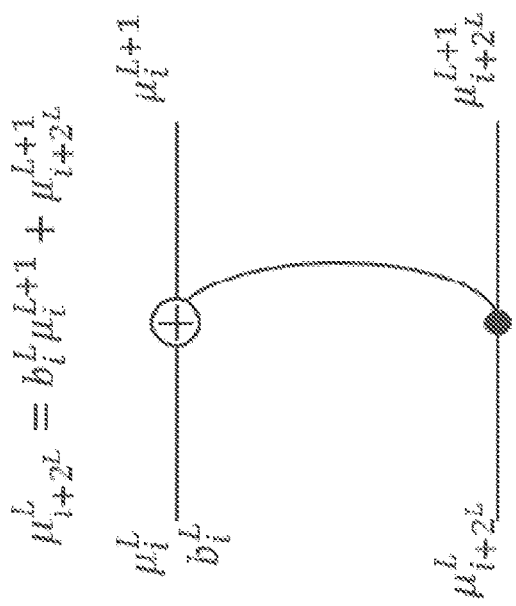
Figure 5B:
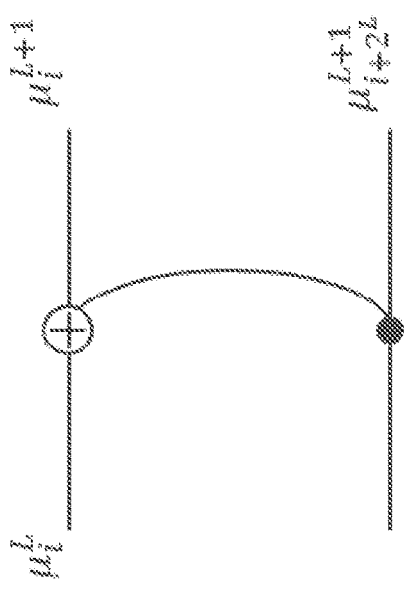

FIG. 4 is a schematic diagram illustrating a code diagram 300 of the same polar code as in FIG. 3 but with more notations added that will be defined below. In FIG. 4 w represents the communications channel 120. During decoding, the information decoder 200 computes soft values for the intermediate bits as well as the input bits, or uncoded bits (consisting partly of information bits (i.e., free bits) and parity bits (i.e., frozen bits)), as illustrated in FIG. 4. In addition, the information decoder 200 successively decides bit values, as also illustrated in FIG. 4. The computed soft values are of two kinds, depending on their bit location in relation to the XOR gates in the code diagram 300. Hereinafter, these bits are denoted upper-left bits and lower-left bits. FIG. 5a illustrates the computation of an upper-left soft value, while FIG. 5b illustrates the computation of a lower-left soft value (where the bit value is represented as +1 or −1). The computation of the upper-left soft value typically uses the so-called boxplus function.

Figure 6:
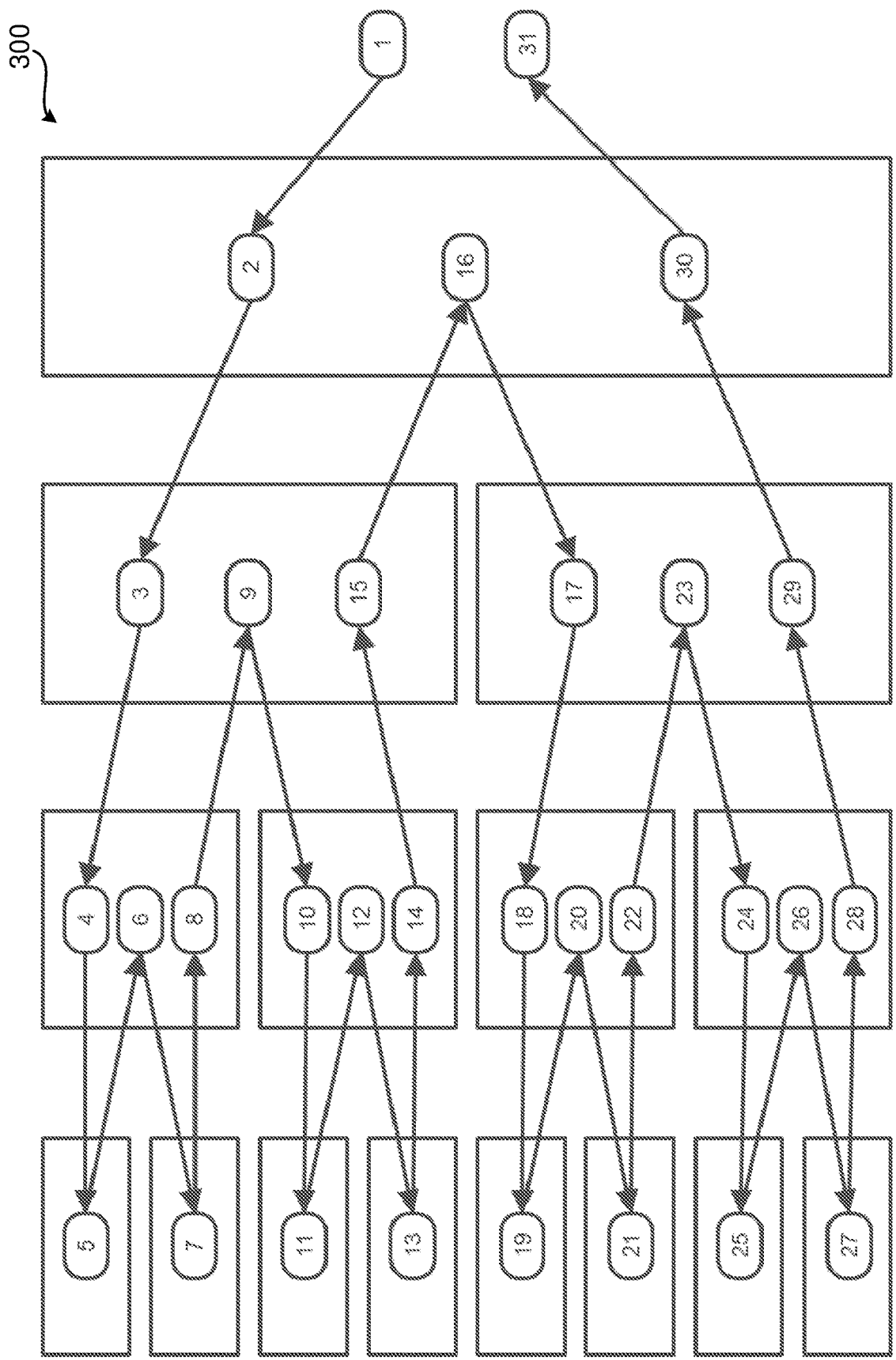

Polar codes can be decoded using successive cancellation (SC) decoding, where the bits are decided successively in a certain order, each bit decision being based on the earlier decisions as illustrated in FIG. 6, which illustrates the traversal steps 1, . . . , 31 during successive decoding where the numbers 1, . . . , 31 illustrate the order in which the corresponding soft values for the bits and the decided information bits in the code diagram 300 are computed.

Figure 7:
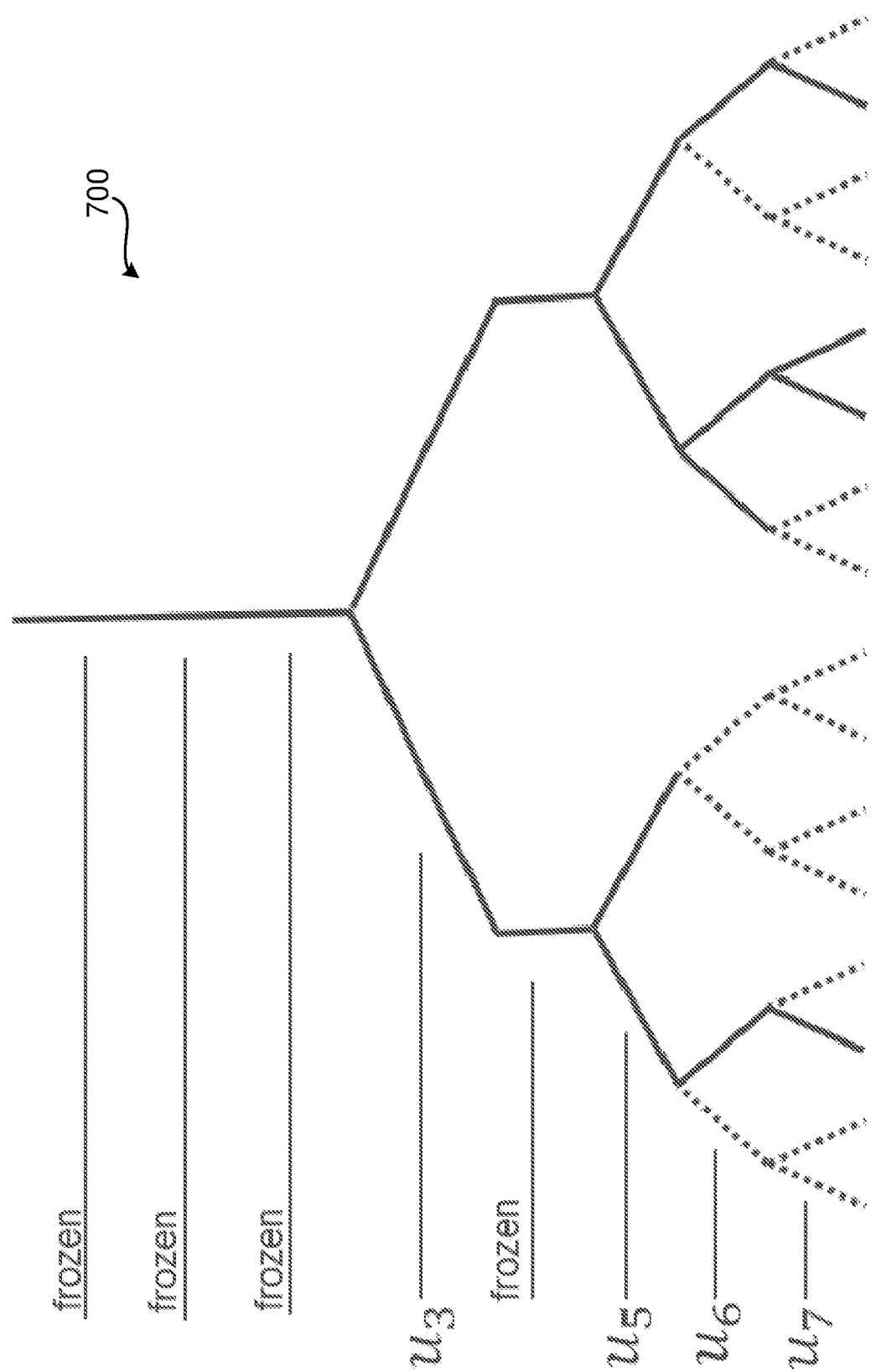
FIG. 7 schematically illustrates list decoding according to an embodiment.

Successive list decoding (or just list decoding for short) is an improved decoding algorithm that provides superior performance at the expense of using more processing power. List decoding considers the information bits successively, similar to SC decoding. But instead of deciding each bit, the list information decoder 200 keeps several candidate decisions, each represented by a candidate decoded sequence (i.e., a partially decoded codeword) and each representing different possible decisions of all bits up to the current point in decoding. Similar to SC decoding, for each candidate decision a number of computed soft values are considered, as well as a number of decided bits. At each point in decoding, the information decoder 200 considers all current candidate decoded sequences, and for each potential candidate considers the two alternatives for the next bit to be decided. This results in twice the number of candidate decoded sequences, and the information decoder 200 therefore evaluates a score for each candidate decoded sequence and decides, for each bit to be decided, which of the candidate decoded sequence to keep and which to discard. Typically the candidate decoded sequences with the highest scores are kept. The kept candidate decoded sequences form the basis for the next step in the successive list decoding. The number of kept candidate decoded sequences is often a fixed small number, such as 4, 8 or 16. A list size of 4 candidate decoded sequences is illustrated in the binary tree 700 of candidate decoded sequences in FIG. 7. The score of how likely it is that the candidate decoded sequence is correct might be determined as the sum of the LLR values of the decoded bits. One reason is that the sum of the LLRs of the individual bits is equivalent to the product of the individual bit probabilities, which is a good measure of how probable a certain bit sequence is.

The score for each candidate decoded sequence is traditionally cumulative, such that a new score is computed as the previous score plus a decision score associated with the current bit decision. The bit decision score might be taken as the product of the soft bit value and the decided bit value (represented as +1 or −1). For instance, in FIG. 4 and bit number 3, the bit decision score is calculated as $\gamma_3 u_3$ where $\gamma_3$ is the soft bit value and $u_3$ is the decided bit value. Because of this, the accumulated score increases when bits are decided in accordance with their soft values, while the accumulated score decreases when bits are decided against their soft values.

Simplified SC decoding (or simplified decoding for short) is a variant of SC decoding where unnecessary processing steps are identified and skipped. This is achieved by considering the polar code as a construction of sub-codes, which is processed recursively by the information decoder 200, and identifying sub-codes of certain types for which recursion can be skipped or replaced by direct decoding. This can be seen in FIG. 8(a), which illustrates the traversal steps during simplified decoding and where the numbers 1, . . . , 11 illustrate the order in which the corresponding soft values for the bits and the decided information bits in the code diagram 300 are computed. Some traversals in the decoding are thus shortcut away to reduce complexity. The information decoder 200 then, in some cases, decides a number of bits together, in one step. Sub-codes that are directly decoded commonly include rate-0 codes, rate-1 codes, repetition codes, and single parity-check codes.

Rate-0 codes might be defined as those codes where all bits have a predetermined value, typically zero, and no information is conveyed. Rate-1 codes might be defined as those codes where all bits can be freely chosen, and there is no redundancy, and thus no error correction occurs. Repetition codes might be defined as those codes with exactly two codewords which differ from each other in all positions (typically the all-zero codeword and the all-one codeword). Single parity-check codes might be defined as those codes where all codewords have a fixed parity (typically even parity, i.e. an even number of binary is, although the opposite is also possible).

Figure 8A:
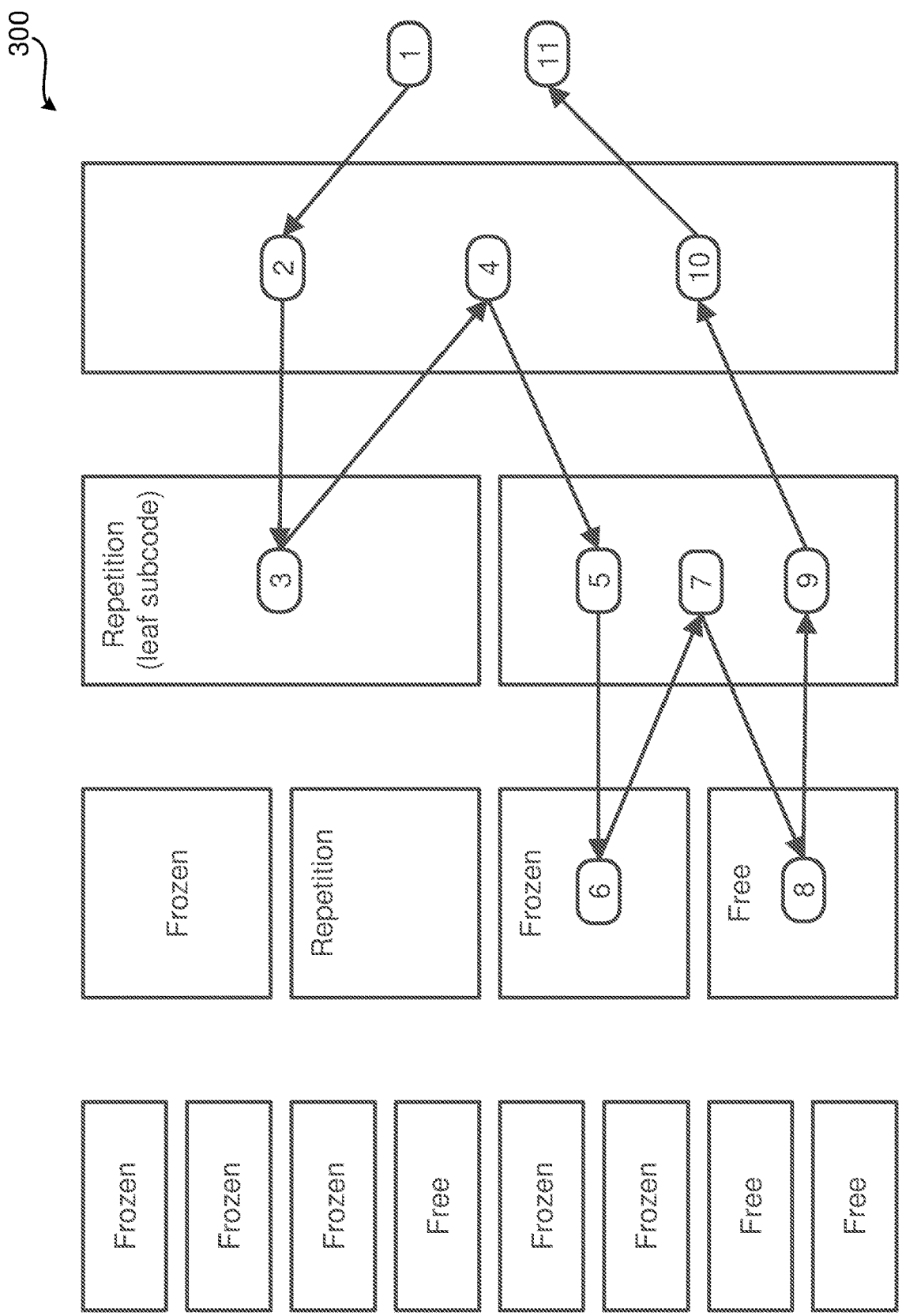
Figure 8B:
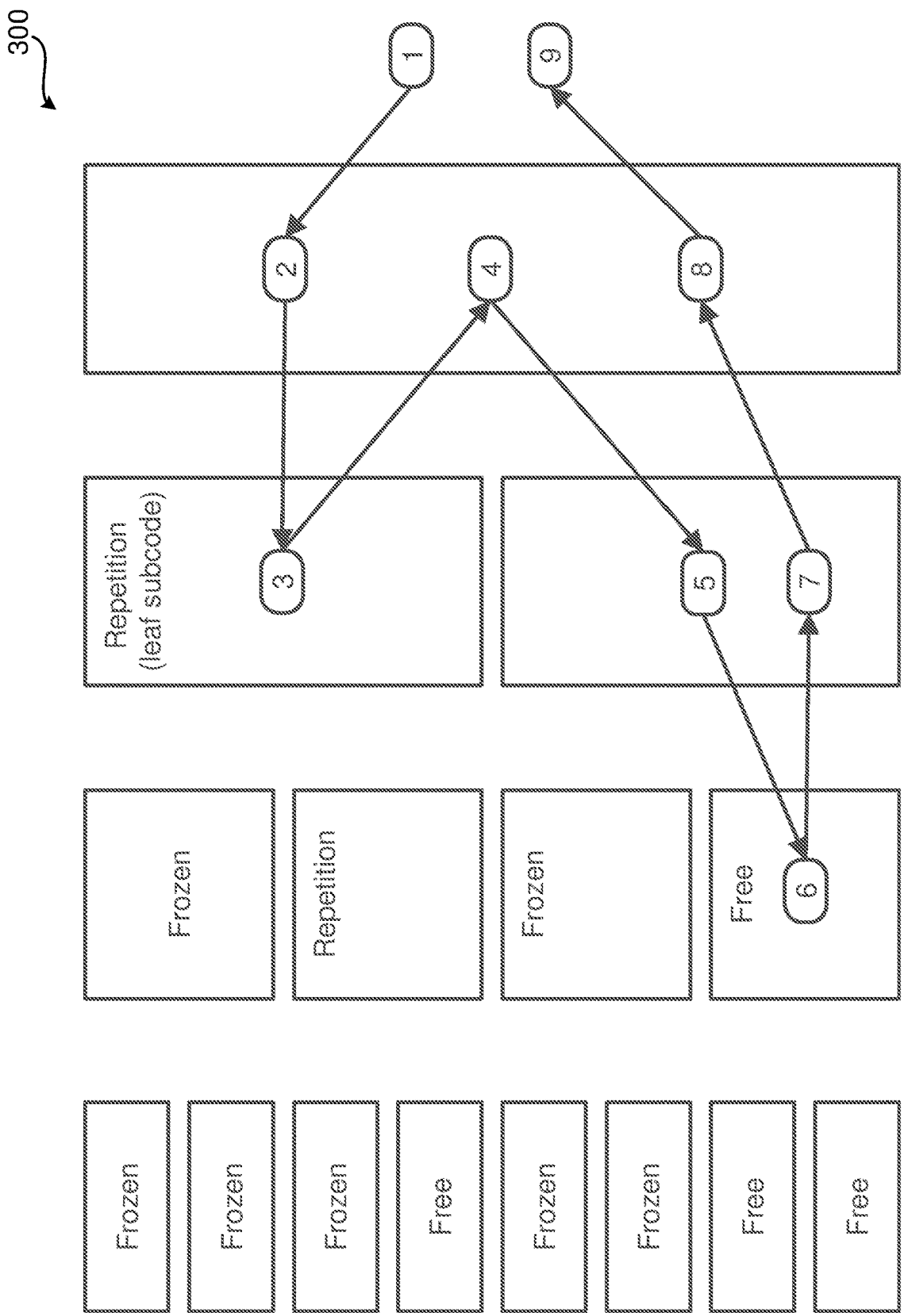

Further simplifications are possible with rate-o codes, as illustrated in FIG. 8(b) which illustrates the traversal steps during simplified decoding and where the numbers 1, ..., 9 illustrate the order in which the corresponding soft values for the bits and the decided information bits in the code diagram 300 are computed. Since the decision will always be zeros, there is no need to compute the soft values that are input to rate-0 codes. Thus, steps 5-6 in FIG. 8(a) can be omitted, resulting in FIG. 8(b).

List decoding can be combined with tree pruning to form simplified list decoding, as in FIG. 8(a). For each candidate decoded sequence, the information decoder 200 then considers all possible alternatives for the sub-code to be decided on, resulting in a number of temporary candidate decoded sequences. The set of all temporary candidate decoded sequences is then evaluated with respect to a score, and the best candidate decoded sequences are kept for the next step. In the context of simplified list decoding, the score is generally computed based on the soft values that are input to each sub-code that for which the simplified processing occurs, for example rate-1 and rate-o sub-codes, as well as repetition codes and single parity-check codes. Specifically, this means that the soft values that are input to all sub-codes need to be computed, including those for rate-o sub-codes. This prohibits some of the computation savings that otherwise could be gained in simplified list decoding.

There is thus a need for improved mechanisms for decoding data having been encoded using polar codes 300.

The embodiments disclosed herein therefore relate to mechanisms for decoding an encoded sequence into a decoded sequence. In order to obtain such mechanisms there is provided an information decoder 200, a method performed by the information decoder 200, a computer program product comprising code, for example in the form of a computer program, that when run on an information decoder 200, causes the information decoder 200 to perform the method.

Figure 9:
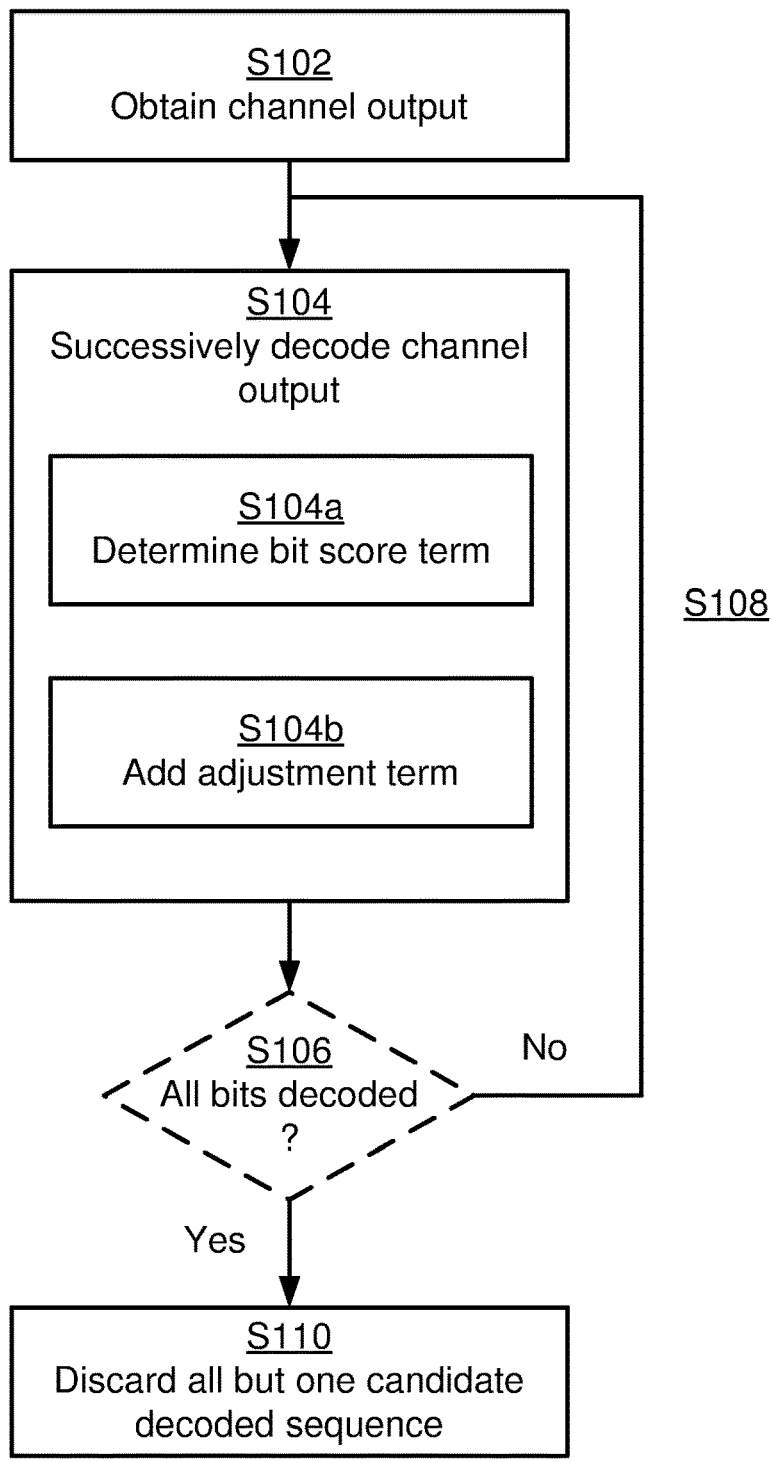
FIG. 9 is a flowchart of methods according to embodiments.

FIG. 9 is a flowchart illustrating embodiments of methods for decoding an encoded sequence into a decoded sequence. The methods are performed by the information decoder 200. The methods are advantageously provided as computer programs 1320.

S102: The information decoder 200 obtains a channel output. The channel output represents the encoded sequence as passed through the communications channel 120. The encoded sequence has been encoded using a polar code. The polar code is representable by a code diagram 300.

S104: The information decoder 200 successively decodes the channel output into the decoded sequence. The encoded sequence is successively being decoded by the information decoder 200 traversing the code diagram 300.

The successive decoding is based on determining new candidate decoded sequences based on already determined candidate decoded sequences, by means of additional bit decisions. Hence, the information decoder 200 is configured to perform step S104a:

S104a: The information decoder 200, whilst traversing the code diagram 300, determines a bit score term for each potential decoding decision on one or more bits being decoded.

When calculating a candidate score corresponding to a potential decoding decision on one or more bits, the candidate score is computed as the bit score term plus an adjustment term. Hence, the information decoder 200 is configured to perform step S104b:

S104b: The information decoder 200, whilst traversing the code diagram 300, adds an adjustment term to each bit score term to form a candidate score for each potential decoding decision.

A respective candidate score is computed for each new candidate decoded sequence, and the candidate decoded sequences with the highest scores are kept.

S108: The information decoder 200 repeats the successive decoding until all bits of the channel output have been decoded, resulting in at least two candidate decoded sequences.

S110: The information decoder 200 discards all but one of the at least two candidate decoded sequences, resulting in one single decoded sequence.

Embodiments relating to further details of decoding an encoded sequence into a decoded sequence as performed by the information decoder 200 will now be disclosed.

In some aspects a check is performed as to whether all bits of the encoded sequence have been decoded or not. Hence, the information decoder 200 is in some aspects configured to perform step S106

S106: The information decoder 200 checks if all bits of the encoded sequence have been decoded. If no, step S108 is entered. If yes, step S110 is entered.

In some aspects the candidate score is used by the information decoder 200 to select which candidate decoded sequence(s) to select for the bits currently being decoded. Particularly, according to an embodiment each potential decoding decision on the one or more bits being decoded results in a respective candidate decoded sequence for these one or more bits being decoded. Each respective candidate decoded sequence has its own candidate score. Which candidate decoded sequence to keep, i.e., to represent these one or more bits being decoded, is then selected based on which candidate score is highest for these one or more bits being decoded.

With regards to the discarding in step S110, the final selection and discarding might be performed based on a cyclic redundancy check (CRC) code (checksum) or other redundancy measure, and hence not on the candidate score.

Aspects of the code diagram 300 will now be disclosed.

According to an embodiment the code diagram 300 is populated by soft values for encoded bits, decided encoded bits, soft values for intermediate bits, decided intermediate bits, and decided input bits. The decided input bits are those bits that define the decoded sequence. One example of such a code diagram 300 is illustrated in FIG. 3. Depending on any code tree simplifications (pruning), only a fraction of the intermediate bits may be considered during decoding. Further, and optionally, the code diagram 300 might comprise soft values for the input bits. However, soft values for input bits might never be calculated, and the decisions for the input bits might be determined only after the candidate decoded sequences have been fully processed.

Aspects of how to determine the bit score term will now be disclosed.

According to an embodiment the bit score term for a particular potential decoding decision is based on the soft values of the bits to be decided on for that particular potential decoding decision.

In general terms, the bit score term is formed as the sum of the pairwise product of the soft values and the corresponding decided bit values. More precisely, in some aspects the bit score term for each potential decoding decision is given by the sum of the individual soft values whose sign is given by the decided bits.

In some aspects, how to determine the bits score term depends on how the binary values are represented during the decoding.

According to a first example, binary numbers are represented by the values +1 and −1, where +1 represents the binary value 0, and where −1 represents binary value 1 (thus defining a +1/−1 representation). According to an embodiment the bit score term for each potential decoding decision is then formed by summing the pairwise product of the soft values and the corresponding decided bit values.

Then, when using the +1/−1 representation, the bit score term for the potential decoding decision for decided intermediate bits $b_i^L, \ldots, b_{i+2^L-1}^L$ is determined according to:

$$\sum_{j=0}^{2^L-1} \mu_{i+j}^L b_{i+j}^L,$$

where $\mu_x^L$ denotes the soft value for the bit with index x at stage L in the code diagram 300, where x=0 for the first bit and L=0 for the input bits and L=m for the coded bits, and where there are n=$2^m$ encoded bits in the encoded sequence. According to an example, $\mu_x^L$ is determined such that:

$$\begin{cases} \mu_i^L = \text{sign}(\mu_i^{L+1} \mu_{i+2^L}^{L+1}) \min(|\mu_i^{L+1}|, |\mu_{i+2^L}^{L+1}|) & (a) \\ \mu_i^L = b_{i-2^L}^L \mu_{i-2^L}^{L+1} + \mu_i^{L+1} & (b). \end{cases}$$

The expression in (a) is applied when mod(i,$2^{L+1}$)<$2^L$, and the expression in (b) is applied when mod(i, $2^{L+1}$)≥$2^L$.

According to a second example, binary numbers are represented by the values +1 and 0, where +1 represents the binary value 0, and where 0 represents binary value 1 (thus defining a 0/1 representation). According to an embodiment the bit score term for each potential decoding decision is then formed by summing the soft values whilst conditionally switching signs for those soft values corresponding to bit value 1 in the bit decision.

Then, when using the 0/1 representation, the bit score term for the potential decoding decision for decided intermediate bits $b_i^L, \ldots, b_{i+2^L-1}^L$ is determined according to:

$$\sum_{j=0}^{2^L-1} \mu_{i+j}^L (1 - 2b_{i+j}^L),$$

where, as before, $\mu_x^L$ denotes the soft value for the bit with index x at stage L in the code diagram 300, where x=0 for the first input bit and L=0 for the input bits and L=m for the coded bits, and where there are n=$2^m$ encoded bits in the encoded sequence. According to an example, $\mu_x^L$ is then determined such that:

$$\begin{cases} \mu_i^L = \text{sign}(\mu_i^{L+1} \mu_{i+2^L}^{L+1}) \min(|\mu_i^{L+1}|, |\mu_{i+2^L}^{L+1}|) & (a) \\ \mu_i^L = (1 - 2b_{i-2^L}^L)\mu_{i-2^L}^{L+1} + \mu_i^{L+1} & (b). \end{cases}$$

The expression in (a) is applied when mod(i, $2^{L+1}$)<$2^L$, and the expression in (b) is applied when mod(i, $2^{L+1}$)≥$2^L$.

As the skilled person understands there could be other representation than the +1/−1 representation and the 0/1 representation, where the above disclosed equations are adapted as necessary.

Aspects of how to determine the adjustment term will now be disclosed.

In some aspects, for a given candidate decoded sequence the candidate score is calculated using the information that is propagated from the right toward the left in the code diagram 300. Hence, according to an embodiment, at any stage in the code diagram 300, the adjustment term is based only on soft values from stages further towards the channel output (encoded bits) in the code diagram 300 (i.e., from stages with higher values of L).

In some aspects the decided input bits define the decoded sequence. According to an embodiment the adjustment term is then determined when traversing the code diagram 300 in direction towards the decided input bits. This enables a respective candidate score to be computed for each given candidate decoded sequence represented by intermediate bits, e.g. intermediate bits {$b_0^2, b_1^2, b_2^2, b_3^2$} in FIG. 4 (which results in $2^4$=16 new candidate decoded sequences from which one or more of the best candidate decoded sequences are kept), without the need to first traverse all the way to the left in the code diagram 300. This makes it possible to harvest the computational savings of simplified list decoding.

Whenever upper-left soft values are computed for one or more bits, as in FIG. 5a, an adjustment term, hereinafter denoted σ, is computed, for example according to FIG. 10a and whenever lower-left soft values are computed for one or more bits, as in FIG. 5b, the adjustment term $\sigma_k$ is computed, for example according to FIG. 10b. Particularly, at stage L in the code diagram 300, the adjustment term might be accumulated when traversing the code diagram 300 from coded bits towards input bits whenever the candidate score is determined for soft values for the bits with indices $\mu_i^L, \ldots, \mu_{i+2^L-1}^L$ corresponding to all adjustment terms with indices 2k, and otherwise kept unchanged, corresponding to all adjustment terms with indices 2k+1, where $$k = 2^{m-L} + \frac{i}{2^L}$$

and where were are n=$2^m$ encoded bits in the encoded sequence.

Figures 10A, 10B:
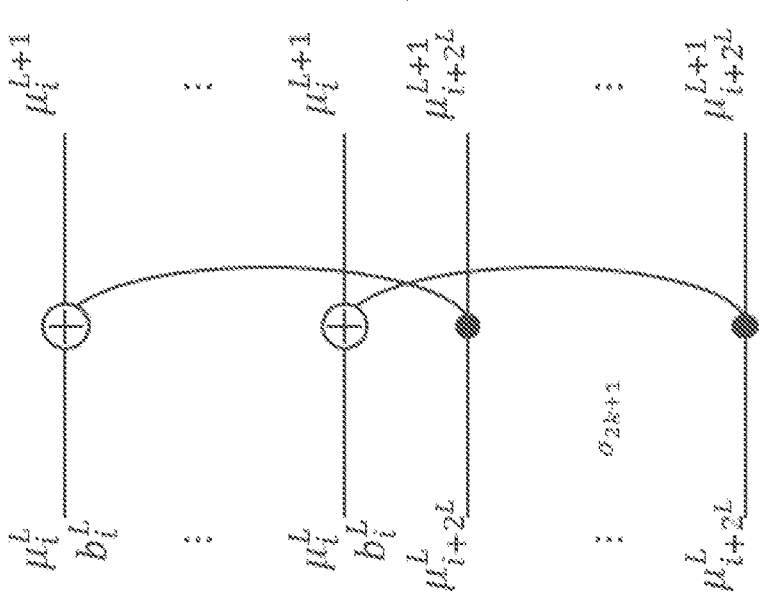

In some aspects the adjustment term is formed by summing the pairwise maxima of the magnitudes of soft value pairs that are arguments to the boxplus function, corresponding to bit pairs connected to the same XOR gate, as illustrated in FIG. 10a and FIG. 10b. That is, according to an embodiment the adjustment term is accumulated by a sum of all pairwise maxima of pairs of soft values $|\mu_{i+j}^{L+1}|$, $|\mu_{i+j+2^L}^{L+1}|$ being added together.

In some aspects the adjustment term is recursively determined. For example, the adjustment term might be accumulated when traversing the code diagram 300 from right to left whenever upper-left soft values are computed, and kept unchanged whenever lower-left soft values are computed. Particularly, according to an embodiment the adjustment term is determined according to:

$$\begin{cases} \sigma_{2k} = \sigma_k + \sum_{j=0}^{2^L-1} \max(|\mu_{i+j}^{L+1}|, |\mu_{i+j+2^L}^{L+1}|), \\ \sigma_{2k+1} = \sigma_k \end{cases}$$

where $\sigma_1$=0, and where $\mu_x^L$ denotes the soft value for the bit with index x at stage L in the code diagram 300, where $$k = 2^{m-L} + \frac{i}{2^L},$$

and where there are $n=2^m$ encoded bits in the encoded sequence. Note that, since $\sigma_1=0$, also some of the $\sigma_k$ terms for $k>1$ will also be zero. For example, for $n=8$ as in the code diagram 300 of FIG. 5, it follows that $\sigma_{15}=\sigma_{13}=\sigma_7=\sigma_3=\sigma_1=0$.

As disclosed above, a bit score term is determined for each potential decoding decision on one or more bits being decoded. Potential decoding decisions can thus be made for a group of intermediate bits, based on their soft values and the corresponding adjustment term, not only on individual bits (and their soft values and adjustment terms).

When performing simplified decoding, some (or all) of the input bits might not be considered when the candidates decoded sequences are formed. The input bits are calculated based on the decided intermediate bits. Depending on the scenario, this can be done after the full encoded sequence has been processed, or alternatively, input bits can be calculated from decided intermediate bits during the simplified decoding. Further, bits with known, fixed, values (i.e., fixed to either zero or one) need not be considered at all during decoding.

In view of the above, one advantage with respect to traditional successive list decoding lies with the determination of the disclosed candidate score. In traditional successive list decoding, the candidate score contains a so-called path metric that is accumulated along all bit decisions taken so far, including bits with known values. For example, in FIG. 8(*a*), to evaluate candidate decoded sequences at traversal step 8, the path metric has to be accumulated at traversal steps 3 and 6. This means that those processing steps have to be performed, including step 6 for which the bits are known. In particular, this hinders the usage of simplifications such as those illustrated in FIG. 8(*b*), where many traversal steps have been collapsed into fewer by means of the considered sub-codes.

The herein disclosed embodiments do not use this form of accumulation. Instead, the disclosed adjustment term a is accumulated from right to left. For instance, in the illustrative example of FIG. 6, the adjustment term used in traversal step 21 is formed in traversal step 17. Therefore, the entire sequence of traversal steps 2 to 15 can be replaced by any simplification, without affecting the adjustment term required in traversal step 21.

Figure 11:
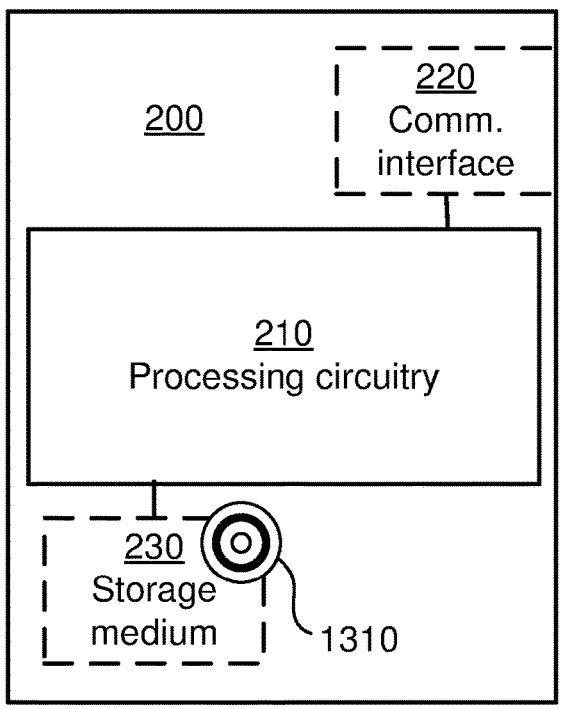
FIG. 11 is a schematic diagram showing functional units of an information decoder according to an embodiment.

FIG. 11 schematically illustrates, in terms of a number of functional units, the components of an information decoder 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 1310 (as in FIG. 13), e.g. in the form of a storage medium 230. The processing circuitry 210 may further be provided as at least one application specific integrated circuit (ASIC), or field programmable gate array (FPGA).

Particularly, the processing circuitry 210 is configured to cause the information decoder 200 to perform a set of operations, or steps, as disclosed above. For example, the storage medium 230 may store the set of operations, and the processing circuitry 210 may be configured to retrieve the set of operations from the storage medium 230 to cause the information decoder 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The information decoder 200 may further comprise a communications interface 220 at least configured at least configured for communications with an information encoder 110. As such the communications interface 220 may comprise one or more transmitters and receivers, comprising analogue and digital components. The processing circuitry 210 controls the general operation of the information decoder 200 e.g. by sending data and control signals to the communications interface 220 and the storage medium 230, by receiving data and reports from the communications interface 220, and by retrieving data and instructions from the storage medium 230. Other components, as well as the related functionality, of the information decoder 200 are omitted in order not to obscure the concepts presented herein.

Figure 12:
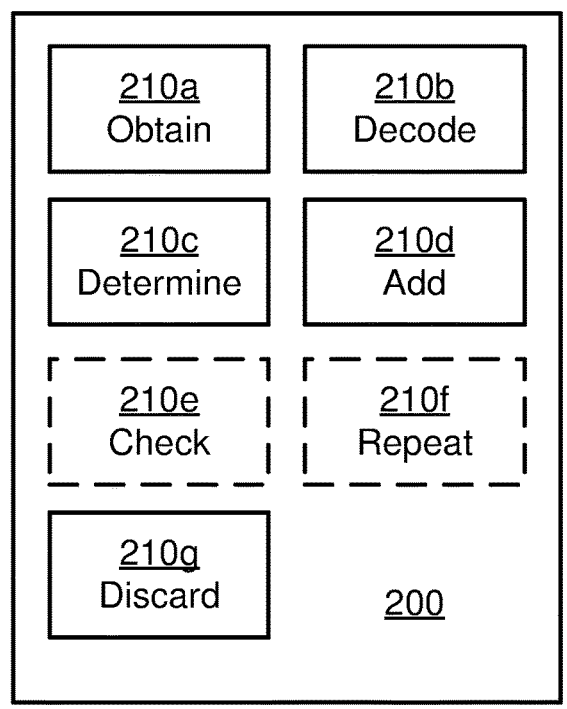
FIG. 12 is a schematic diagram showing functional modules of an information decoder according to an embodiment.

FIG. 12 schematically illustrates, in terms of a number of functional modules, the components of an information decoder 200 according to an embodiment. The information decoder 200 of FIG. 12 comprises a number of functional modules; an obtain module 210*a* configured to perform step S102, a decode module 210*b* configured to perform step S104, a determine module 210C configured to perform step S104*a*, an add module 210*d* configured to perform step S104*b*, and a discard module 210*g* configured to perform step S110. The information decoder 200 of FIG. 12 may further comprise a number of optional functional modules, such as any of a check module 210*e* configured to perform step S106 and a repeat module 210*f* configured to perform step S108.

In general terms, each functional module 210*a*-210*g* may in one embodiment be implemented only in hardware and in another embodiment with the help of software, i.e., the latter embodiment having computer program instructions stored on the storage medium 230 which when run on the processing circuitry makes the information decoder 200 perform the corresponding steps mentioned above in conjunction with FIG. 12. It should also be mentioned that even though the modules correspond to parts of a computer program, they do not need to be separate modules therein, but the way in which they are implemented in software is dependent on the programming language used. Preferably, one or more or all functional modules 210*a*-210*g* may be implemented by the processing circuitry 210, possibly in cooperation with the communications interface 220 and/or the storage medium 230. The processing circuitry 210 may thus be configured to from the storage medium 230 fetch instructions as provided by a functional module 210*a*-210*g* and to execute these instructions, thereby performing any steps as disclosed herein.

The information decoder 200 may be provided as a standalone device or as a part of at least one further device. For example, the information decoder 200 may be provided in a radio access network node (such as in a radio base station, a base transceiver station, a node B, or an evolved node B) or in an end-user device (such as in a portable wireless device, a mobile station, a mobile phone, a handset, a wireless local loop phone, a user equipment (UE), a smartphone, a laptop computer, a tablet computer, a sensor device, an Internet of Things device, or a wireless modem).

Thus, a first portion of the instructions performed by the information decoder 200 may be executed in a first device, and a second portion of the of the instructions performed by the information decoder 200 may be executed in a second device; the herein disclosed embodiments are not limited to any particular number of devices on which the instructions performed by the information decoder 200 may be executed. Hence, the methods according to the herein disclosed embodiments are suitable to be performed by an information decoder 200 residing in a cloud computational environment. Therefore, the processing circuitry 210 may be distributed among a plurality of devices, or nodes. The same applies to the functional modules 210a-210g of FIG. 12 and the computer program 1320 of FIG. 13 (see below).

Figure 13:
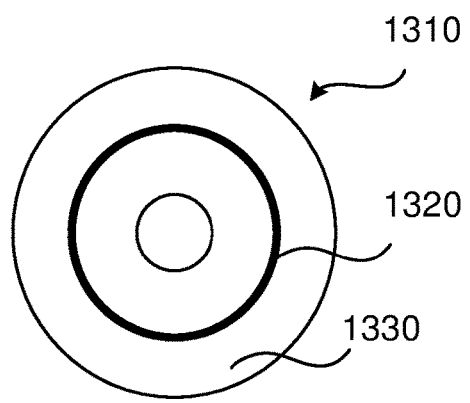
FIG. 13 shows one example of a computer program product comprising computer readable storage medium according to an embodiment.

FIG. 13 shows one example of a computer program product 1310 comprising computer readable storage medium 1330. On this computer readable storage medium 1330, a computer program 1320 can be stored, which computer program 1320 can cause the processing circuitry 210 and thereto operatively coupled entities and devices, such as the communications interface 220 and the storage medium 230, to execute methods according to embodiments described herein. The computer program 1320 and/or computer program product 1310 may thus provide means for performing any steps as herein disclosed.

In the example of FIG. 13, the computer program product 1310 is illustrated as an optical disc, such as a CD (compact disc) or a DVD (digital versatile disc) or a Blu-Ray disc. The computer program product 1310 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1320 is here schematically shown as a track on the depicted optical disk, the computer program 1320 can be stored in any way which is suitable for the computer program product 1310.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for decoding an encoded sequence into a decoded sequence, the method being performed by an information decoder, the method comprising:
   obtaining a channel output, the channel output representing the encoded sequence as passed through a communications channel, the encoded sequence having been encoded using a polar code, wherein the polar code is representable by a code diagram;
   successively decoding the channel output into the decoded sequence by traversing the code diagram, and while doing so:
   computing soft values for encoded bits, decided encoded bits and soft values for intermediate bits, decided intermediate bits, and decided input bits;
   determining a bit score term for each potential decoding decision on one or more bits being decoded; and
   adding an adjustment term to each bit score term to form a candidate score for said each potential decoding decision;
   wherein the successive decoding is repeated until all bits of the channel output have been decoded, resulting in at least two candidate decoded sequences; and
   discarding all but one of the at least two candidate decoded sequences, resulting in one single decoded sequence,
   wherein each potential decoding decision on said one or more bits being decoded results in a respective candidate decoded sequence for said one or more bits being decoded, each with its own candidate score, and wherein which candidate decoded sequence to represent said one or more bits being decoded is selected based on which candidate score is highest for said one or more bits being decoded.

2. The method according to claim 1, wherein the bit score term for a particular potential decoding decision is based on the soft values of the bits to be decided on for that particular potential decoding decision.

3. The method according to claim 2, wherein the soft values take values in the range −1 to +1, wherein 1 represents bit value 1 and +1 represents bit value 0, and wherein the bit score term for each potential decoding decision is formed by summing the pairwise product of the soft values and the corresponding decided bit values.

4. The method according to claim 3, wherein the bit score term for the potential decoding decision for decided intermediate bits $b_1^L, \ldots, b_{i+2^L-1}^L$ is determined according to:

$$\sum_{j=0}^{2^L-1} \mu_{i+j}^L b_{i+j}^L,$$

where $\mu_m^L$ denotes the soft value for the bit with index x at stage L in the code diagram, where x=0 for the first input bit and L=0 for the input bits and L=m for the coded bits, and where there are $n=2^m$ encoded bits in the encoded sequence.

5. The method according to claim 4, where:

$$\begin{cases} \mu_i^L = \text{sign}(\mu_i^{L+1} \mu_{i+2^L}^{L+1}) \min(|\mu_i^{L+1}|, |\mu_{i+2^L}^{L+1}|) \\ \mu_{i+2^L}^L = b_i^L \mu_i^{L+1} + \mu_{i+2^L}^{L+1} \end{cases}.$$

6. The method according to claim 2, wherein the soft values take values in the range 0 to +1, wherein 0 represents bit value −1 and +1 represents bit value 0, and wherein the bit score term for each potential decoding decision is formed by summing the soft values while conditionally switching signs for those soft values corresponding to bit value 1 in the bit decision.

7. The method according to claim 6, wherein the bit score term for the potential decoding decision for decided intermediate bits $b_1^L, \ldots, b_{i+2^L-1}^L$ is determined according to:

$$\sum_{j=0}^{2^L-1} \mu_{i+j}^L (1 - 2b_{i+j}^L),$$

where $\mu_x^L$ denotes the soft value for the bit with index x at stage L in the code diagram, where x=0 for the first input bit and L=0 for the input bits and L=m for the coded bits, and where there are $n=2^m$ encoded bits in the encoded sequence.

8. The method according to claim 7, where:

$$\begin{cases} \mu_i^L = \text{sign}(\mu_i^{L+1}\mu_{i+2^L}^{L+1})\min(|\mu_i^{L+1}|, |\mu_{i+2^L}^{L+1}|) \\ \mu_{i+2^L}^L = (1-2b_i^L)\mu_i^{L+1} + \mu_{i+2^L}^{L+1} \end{cases}.$$

9. The method according to claim 1, wherein, at any stage in the code diagram, the adjustment term is based only on soft values from stages further towards the encoded bits in the code diagram.

10. The method according to claim 1, wherein the decided input bits define the decoded sequence, and wherein the adjustment term is determined when traversing the code diagram in direction towards the decided input bits.

11. The method according to claim 9, wherein, at stage L in the code diagram, the adjustment term is accumulated when traversing the code diagram from coded bits towards input bits whenever the candidate score is determined for soft values for the bits with indices $\mu_1^L, \ldots, \mu_{i+2^L-1}^L$, corresponding to all adjustment terms with indices 2k, and otherwise kept unchanged, corresponding to all adjustment terms with indices 2k+1, where $$k = 2^{m-L} + \frac{i}{2^L}$$

and where mere are $n=2^m$ encoded bits in the encoded sequence.

12. The method according to claim 11, wherein the adjustment term is accumulated by a sum of all pairwise maxima of pairs of soft values $|\mu_{i+j}^{L+1}|$, $|\mu_{i+j+2^L}^{L+1}|$ being added together.

13. The method according to claim 12, wherein the adjustment term is determined according to:

$$\begin{cases} \sigma_{2k} = \sigma_k + \sum_{j=0}^{2^L-1} \max(|\mu_{i+j}^{L+1}|, |\mu_{i+j+2^L}^{L+1}|), \\ \sigma_{2k+1} = \sigma_k \end{cases}$$

where $\sigma_1=0$, and where $\mu_k^L$ denotes the soft value for the bit with index x at stage L in the code diagram, where $$k = 2^{m-L} + \frac{i}{2^L}$$

and where there are $n=2^m$ encoded bits in the encoded sequence.

14. An information decoder for decoding an encoded sequence into a decoded sequence, the information decoder comprising processing circuitry, the processing circuitry being configured to cause the information decoder to:
obtain a channel output, the channel output representing the encoded sequence as passed through a communications channel, the encoded sequence having been encoded using a polar code, wherein the polar code is representable by a code diagram;
successively decode the channel output into the decoded sequence by traversing the code diagram, and while doing so:
compute soft values for encoded bits, decided encoded bits and soft values for intermediate bits, decided intermediate bits, and decided input bits;
determine a bit score term for each potential decoding decision on one or more bits being decoded; and
add an adjustment term to each bit score term to form a candidate score for said each potential decoding decision;
wherein the successive decoding is repeated until all bits of the channel output have been decoded, resulting in at least two candidate decoded sequences; and
discard all but one of the at least two candidate decoded sequences, resulting in one single decoded sequence,
wherein each potential decoding decision on said one or more bits being decoded results in a respective candidate decoded sequence for said one or more bits being decoded, each with its own candidate score, and wherein which candidate decoded sequence to represent said one or more bits being decoded is selected based on which candidate score is highest for said one or more bits being decoded.

15. A non-transitory computer readable medium storing a computer program product for decoding an encoded sequence into a decoded sequence, the computer program product comprising computer code which, when run on processing circuitry of an information decoder, causes the information decoder to:
obtain a channel output, the channel output representing the encoded sequence as passed through a communications channel, the encoded sequence having been encoded using a polar code, wherein the polar code is representable by a code diagram;
successively decode the channel output into the decoded sequence by traversing the code diagram, and while doing so:
compute soft values for encoded bits, decided encoded bits and soft values for intermediate bits, decided intermediate bits, and decided input bits;
determine a bit score term for each potential decoding decision on one or more bits being decoded; and
add an adjustment term to each bit score term to form a candidate score for said each potential decoding decision;
wherein the successive decoding is repeated until all bits of the channel output have been decoded, resulting in at least two candidate decoded sequences; and
discard all but one of the at least two candidate decoded sequences, resulting in one single decoded sequence,
wherein each potential decoding decision on said one or more bits being decoded results in a respective candidate decoded sequence for said one or more bits being decoded, each with its own candidate score, and wherein which candidate decoded sequence to represent said one or more bits being decoded is selected based on which candidate score is highest for said one or more bits being decoded.

* * * * *